United States Patent
Matsushima et al.

(10) Patent No.: US 7,369,406 B2
(45) Date of Patent: May 6, 2008

(54) DISK ARRAY APPARATUS

(75) Inventors: Hitoshi Matsushima, Ryugasaki (JP);
Hiroshi Fukuda, Odawara (JP)

(73) Assignee: Hitachi, Ltd., Tokyo (JP)

( * ) Notice: Subject to any disclaimer, the term of this patent is extended or adjusted under 35 U.S.C. 154(b) by 178 days.

(21) Appl. No.: 11/345,545

(22) Filed: Feb. 2, 2006

(65) Prior Publication Data

US 2007/0109744 A1    May 17, 2007

(30) Foreign Application Priority Data

Nov. 11, 2005   (JP) .............................. 2005-326919

(51) Int. Cl.
*H05K 7/20*   (2006.01)
(52) U.S. Cl. ...................... 361/695; 361/687; 361/716; 165/104.33; 454/184
(58) Field of Classification Search .................... None
See application file for complete search history.

(56) References Cited

U.S. PATENT DOCUMENTS

| | | | | |
|---|---|---|---|---|
| 5,414,591 A | * | 5/1995 | Kimura et al. ............... | 361/695 |
| 6,005,770 A | * | 12/1999 | Schmitt ....................... | 361/695 |
| 6,115,250 A | * | 9/2000 | Schmitt ....................... | 361/695 |
| 6,288,897 B1 | * | 9/2001 | Fritschle et al. ............. | 361/687 |
| 6,392,884 B1 | * | 5/2002 | Chou .......................... | 361/687 |
| 6,563,706 B1 | * | 5/2003 | Strickler ..................... | 361/695 |
| 6,754,082 B1 | * | 6/2004 | Ding et al. .................. | 361/727 |
| 7,042,720 B1 | * | 5/2006 | Konshak et al. ............. | 361/687 |
| 7,043,739 B2 | * | 5/2006 | Nishiyama et al. ......... | 720/600 |

FOREIGN PATENT DOCUMENTS

| | | |
|---|---|---|
| JP | 03-039880 | 2/1991 |
| JP | 05-234237 | 9/1993 |
| JP | 11-022698 | 1/1999 |
| JP | 2003-280823 | 10/2003 |
| JP | 2005-057119 | 3/2005 |

* cited by examiner

*Primary Examiner*—Boris Chérvinsky
(74) *Attorney, Agent, or Firm*—Antonelli, Terry, Stout & Kraus, LLP.

(57) ABSTRACT

A disk array apparatus comprises a casing, a disk drive group configured by a plurality of disk drives, a controller unit configured by a plurality of circuit substrates, a plurality of cooling fans, and backflow prevention members. The plurality of cooling fans is provided so as to be aligned between the disk drive group and the controller unit in the casing. The backflow prevention members are provided so as to protrude on the side of the disk drive group or on the side of the controller unit from between the cooling fans while extending to define a space on the inlet side or the outlet side of the cooling fans.

9 Claims, 8 Drawing Sheets

DISK ARRAY APPARATUS

CLAIM OF PRIORITY

The present application claims priority from Japanese application serial JP 2005-326919 filed on Nov. 11, 2005, the content of which is hereby incorporated by reference into this application.

FIELD OF THE INVENTION

The present invention relates to a disk array apparatus, and particularly to a disk array apparatus comprising a plurality of magnetic or optical disk drives and a plurality of cooling fans therefor.

BACKGROUND OF THE INVENTION

For the purpose of improving reliability of data storage, a disk array apparatus is configured in such a manner that a plurality of magnetic or optical disk drives is mounted in a casing. The disk array apparatuses are connected with each other through dedicated high-speed network lines such as optical network lines, managed by management software, and utilized as SAN (Storage Area Network) disk array apparatuses, NAS (Network Attached Storage) disk array apparatuses, or a sole RAID (Redundant Array of Inexpensive Disks) disk array apparatus.

Each of the disk drives mounted on these disk array apparatuses is configured by a disk body mounting therein a disk, a driving motor, a head, an actuator, and the like, connectors for connecting electronic components for control, and the like. Main heating sources of the disk drive are the electronic components for control such as the driving motor, the actuator, and an LSI. The heat generated by these components is cooled by cooling air supplied by cooling fans provided in a disk array casing. If the disk array apparatus is poor in cooling capability, the temperature of the disk drives rises or the temperature varies between a plurality of disk drives. As a result, there is concern that the disk array apparatus malfunctions and reliability in the long term is deteriorated. For example, the variation in temperature between a plurality of disk drives causes deviation in timing of electronic circuits, which results in the possibility of a trouble in accessing from a controller to the disk drives and the possibility of a delay in time required to transfer data. Further, if the temperature of the disk drives rises, a lubricating layer applied on the surface of a magnetic disk is deteriorated and the magnetic disk is likely to be damaged.

Furthermore, it is an important issue to reduce noise generated by the cooling fans that are driven to supply cooling air to the disk drives in the disk array apparatus.

Moreover, in the disk array apparatus, reliability in data retention and data processing becomes extremely important. This fact is applied even in the event of a failure in a cooling system of the disk array apparatus itself. That is, even if a part of the fans for cooling the disk array apparatus fails to operate properly, the system needs to be operated without a halt until the repair is completed. In other words, it is necessary to secure cooling redundancy.

In accordance with a system configuration, a plurality of disk array apparatuses are horizontally installed or a sole disk array apparatus is vertically installed on, for example, a standard 19-inch rack in many cases. Accordingly, it is important that the cooling capability including the cooling redundancy is not affected by the installing direction of the casing.

As described above, the important issues for the disk array apparatus are as follows: a disk drive group needs to be cooled uniformly; the cooling redundancy for the disk drives needs to be secured; and noise generated by the cooling fans needs to be cut without being affected by the installing direction of the casing.

In a conventional disk array apparatus, there is shown a technique for preventing the cooling efficiency from rapidly decreasing by providing a shutter so that outside air does not flow back through the cooling fans in the event of a failure of the cooling fans (refer to Japanese Patent Laid-Open No. H11 (1999)-22698).

Further, in a conventional cooling apparatus for electronic devices, there is described a cooling technique in which a plurality of cooling fans are provided in the vicinities of heating components, and all the cooling fans are operated under the normal condition. If any one of the cooling fans fails to operate properly, air volume of the other cooling fans is controlled (refer to Japanese Patent Laid-Open No. 2005-57119).

Further, in a conventional disk array apparatus, there is disclosed a technique for improving a robust property and decay durability of a system by keeping some of a plurality of disk drives always in the standby mode (refer to Japanese Patent Laid-Open No. 2003-280823).

Further, in a disk storage apparatus, there is disclosed a control technique for stopping a write operation or spindle rotations when the temperature of an enclosure exceeds an allowable value due to a failure of the cooling fans (refer to Japanese Patent Laid-Open No. H05 (1993)-234237).

Further, in a conventional electronic device, there is disclosed a control technique in which combinations of a plurality of cooling fans arranged above and below a shelf, and the shelf, are divided into predetermined groups, and if the cooling fans fail to operate properly, an alarm is generated on a group unit basis and the group is made out of system (refer to Japanese Patent Laid-Open No. H03 (1991)-39880).

In the conventional technique according to Japanese Patent Laid-Open No. H11 (1999)-22698, the backflow can be completely prevented from occurring in the event of a failure of the cooling fans. However, since the shutter is opened and closed by its own weight, the installing direction of the casing is largely restricted. Further, there is a case wherein the sufficient amount of cooling air flow can not be obtained due to a large loss of air flow caused by keeping the shutter open. Further, there is a case wherein a slight difference in flow path condition produces a difference in flowing pressure between the plurality of fans, so that the shutter is intermittently opened and closed. In such a case, abnormal noise, which extremely annoys a user, is intermittently generated from the casing of the apparatus.

The conventional technique according to Japanese Patent Laid-Open No. 2005-57119 raises a problem of the air backflow through the cooling fans in the event of a failure of the cooling fans, which is also a problem in the conventional technique according to Japanese Patent Laid-Open No. H11 (1999)-22698. Therefore, it is necessary to prepare a plurality of large cooling fans having large fan properties in order to secure the sufficient amount of cooling air flow necessary and enough to cool all the disk drives in a good condition even in the event of a failure of the cooling fans. This case causes a problem of increasing noise generated by the fan.

The conventional technique according to Japanese Patent Laid-Open No. 2003-280823 allows the load of the disk drives to be equalized, and as a result, the temperature of the disk drives is equalized. However, the technique does not solve the problem that the temperature of the disk drives rises in the event of a failure of the cooling fans.

In the conventional technique according to Japanese Patent Laid-Open No. H05 (1993)-234237, although a control method by the disk drive alone is described, behavior of the whole system in which a plurality of disk drives is aligned is not disclosed.

In the conventional technique according to Japanese Patent Laid-Open No. H03 (1991)-39880, a combination of cooling fans arranged above and below a shelf and the shelf is classified as one group. In the case where a target electronic device is a disk array apparatus, the plurality of disk drives is accommodated in the shelf. In this case, if all the disk drives in the shelf are stopped due to a failure of the cooling fan, the usability of the system in the other disk drive group being operated is decreased, and in addition, the load of the system imposed by saving data for the disk drive group in the stopped shelf to the other disk drive group in the other shelf is increased. Alternatively, in many cases, it is difficult to place a plurality of cooling fans above and below each shelf due to a problem of securing spaces on the locations where the fans are placed and a problem of noise generated by the fans. In such a case, the cooling fans are arranged in front or rear of the shelf. However, in such a configuration, if the cooling fans in the shelf fail to operate properly, the disk drive group in the shelf needs to be stopped immediately and the cooling redundancy can not be secured.

The object of the present invention is to provide a disk array apparatus that enables to uniformly cool a disk drive group, to secure the cooling redundancy of a disk drive group, and to reduce noise generated by cooling fans without being affected by the installing direction of the casing.

SUMMARY OF THE INVENTION

In order to achieve the above-described object, there is provided a disk array apparatus according to a first aspect of the present invention, comprising: a casing having an inlet on one side and an outlet on the other side; a disk drive group configured by a plurality of disk drives that are arranged on one side in the casing; a controller unit configured by a plurality of circuit substrates that are arranged on the other side in the casing; and a plurality of cooling fans for ventilating the disk drive group and the controller unit, wherein: the plurality of cooling fans are arranged between the disk drive group and the controller unit in the casing and are provided while being aligned so as to draw in cooling air from the side of the disk drive group and make the cooling air flow to the side of the controller unit; and backflow prevention members are provided so as to protrude on the side of the disk drive group or on the side of the controller unit from between the cooling fans while extending so as to define a space on the inlet side or on the outlet side of the cooling fans.

The preferred and concrete configuration examples in the first aspect of the present invention are as follows.

(1) Each of the backflow prevention members extends so as to protrude on the side of the disk drive group or on the side of the controller unit from between each of the cooling fans, which are positioned at both ends and are adjacent to wall faces of the casing, and each of the cooling fans, which are positioned on the middle side and are adjacent to the cooling fans that are positioned at both ends.

(2) According to (1), each of the backflow prevention members extends so as to protrude on the side of the controller unit towards the outlet of the casing-from between each of cooling fans, which are positioned at both ends and are adjacent to the wall faces of the casing, and each of the cooling fans, which are positioned on the middle side and are adjacent to the cooling fans that are positioned at both ends, while providing a space between each of the backflow prevention members and each of the wall faces of the casing.

(3) According to (2), each of power sources is arranged in each of spaces formed between each of the backflow prevention members and each of the wall faces of the casing and each of the cooling fans is provided even on the outlet side of each of the spaces.

(4) According to (1), each of the backflow prevention members extends so as to become closer to each of the wall faces of the casing as being apart from the cooling fans while providing a space for ventilation between each of the tip ends of the backflow prevention members and each of the wall faces of the casing.

(5) According to (1), each of the backflow prevention members extends up to each of the wall faces of the casing from between the cooling fans while protruding on the side of the controller unit and there is formed each of auxiliary outlets in communication with each of spaces formed by each of the both wall faces of the casing and each of the backflow prevention members.

(6) A resistive element, on which a plurality of ventilating holes are uniformly formed, is provided between the aligned cooling fans and the disk drive group and the backflow prevention members are provided between the resistive element and the cooling fans.

(7) According to (6), the backflow prevention members are provided so as to define all boundaries between the cooling fans that are aligned.

In order to achieve the above-described object, there is provided a disk array apparatus according to a second aspect of the present invention, comprising: a casing having an inlet on one side and an outlet on the other side; a disk drive group configured by a plurality of disk drives that are arranged on one side in the casing; a controller unit configured by a plurality of circuit substrates that are arranged on the other side in the casing; and a plurality of cooling fans for ventilating the disk drive group and the controller unit, wherein: the plurality of cooling fans are arranged between the disk drive group and the controller unit in the casing and are provided while being aligned so as to draw in cooling air from the side of the disk drive group and make the cooling air flow to the side of the controller unit; and control means is provided so that when the cooling fans positioned at both ends abnormally stop, information stored on the disk drives within each of specified areas in the vicinities of the cooling fans positioned at both ends in the casing is transferred to the other disk drives located outside the specified areas, and then the disk drives within each of the specified areas are stopped.

The preferred and concrete configuration examples in the second aspect of the present invention are as follows.

Further, in order to achieve the above-described object, there is provided a disk array apparatus according to a third aspect of the present invention, comprising: a casing having an inlet on one side and an outlet on the other side; a disk drive group configured by a plurality of disk drives that are arranged on one side in the casing; a controller unit configured by a plurality of circuit substrates that are arranged on the other side in the casing; and a plurality of cooling fans for ventilating the disk drive group and the controller unit, wherein: the plurality of cooling fans are arranged between the disk drive group and the controller unit in the casing and are provided while being aligned so as to draw in cooling air from the side of the disk drive group and make the cooling air flow to the side of the controller unit; and the disk drives within each of the specified areas in the vicinities of the cooling fans positioned at both ends in the casing are dummies.

Further, in order to achieve the above-described object, there is provided a disk array apparatus according to a fourth aspect of the present invention, comprising: a casing having an inlet on one side and an outlet on the other side; a disk drive group configured by a plurality of disk drives that are arranged on one side in the casing; a controller unit configured by a plurality of circuit substrates that are arranged on the other side in the casing; and a plurality of cooling fans for ventilating the disk drive group and the controller unit, wherein: the plurality of cooling fans are arranged between the disk drive group and the controller unit in the casing and are provided while being aligned so as to draw in cooling air from the side of the disk drive group and make the cooling air flow on the side of the controller unit; a temperature sensor for monitoring the temperature of the respective disk drives is mounted on each of the disk drives; when any one of the temperature sensors exceeds a first preset temperature, the controller unit backs up data stored on the disk drive exceeding the first preset temperature to the other disk drive and switches the disk drive exceeding the first preset temperature from the "ready" status to the "not ready" status after the backup of the data is completed; and when the temperature of the disk drive exceeding the first preset temperature lowers below a second preset temperature which is lower than the first preset temperature, the controller unit returns the disk drive from the "not ready" status to the "ready" status.

The preferred and concrete configuration example in the respective aspects of the present invention is as follows.
(1) Portions corresponding to areas of the disk drive group and the cooling fans, of covers configuring an upper face of the casing are divided on a predetermined unit.

According to a disk array apparatus of the present invention, it is possible to uniformly cool a disk drive group, to secure the cooling redundancy of a disk drive group, and to reduce noise generated by cooling fans without being affected by the installing direction of the casing. As a result, it is possible to improve reliability of the disk array apparatus, to prolong the service life of the disk array apparatus, and to make the disk array apparatus high density, realizing the disk array apparatus with low-noise, high-capacity, and high-speed.

DETAILED DESCRIPTION OF THE PREFERRED EMBODIMENTS

Figure 1A:
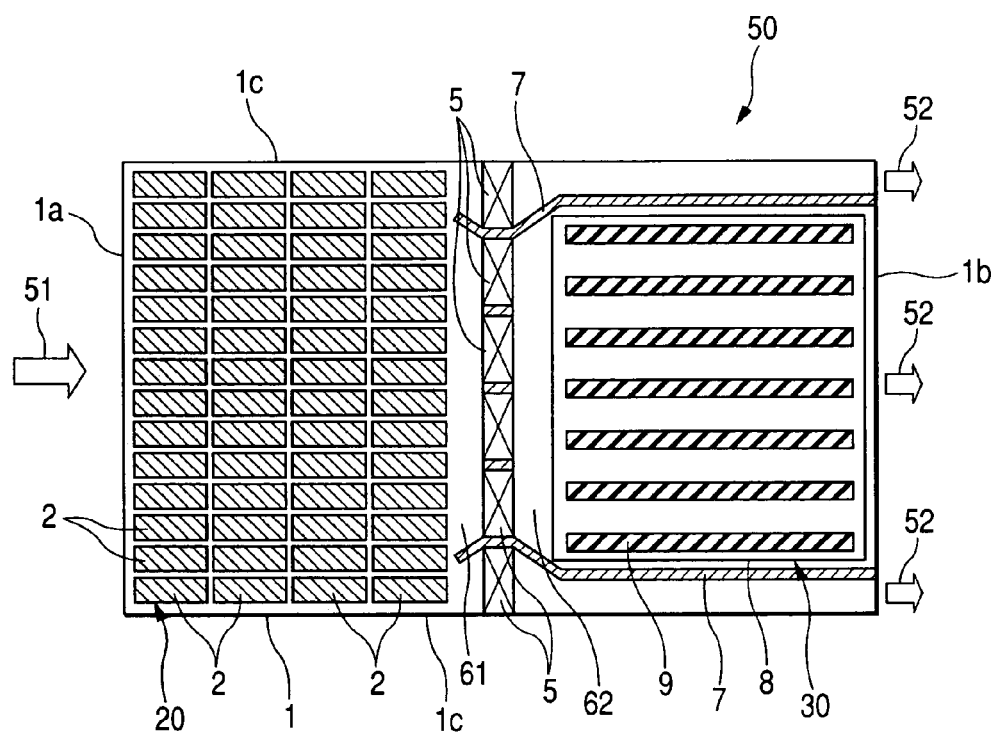
FIG. 1A is a plan sectional view of a disk array apparatus according to a first embodiment of the present invention.

Hereinafter, several embodiments of the present invention will be described with reference to the drawings. The identical numeral denotes the identical element or the equivalent in the drawings of each embodiment.

First Embodiment

Figure 1B:
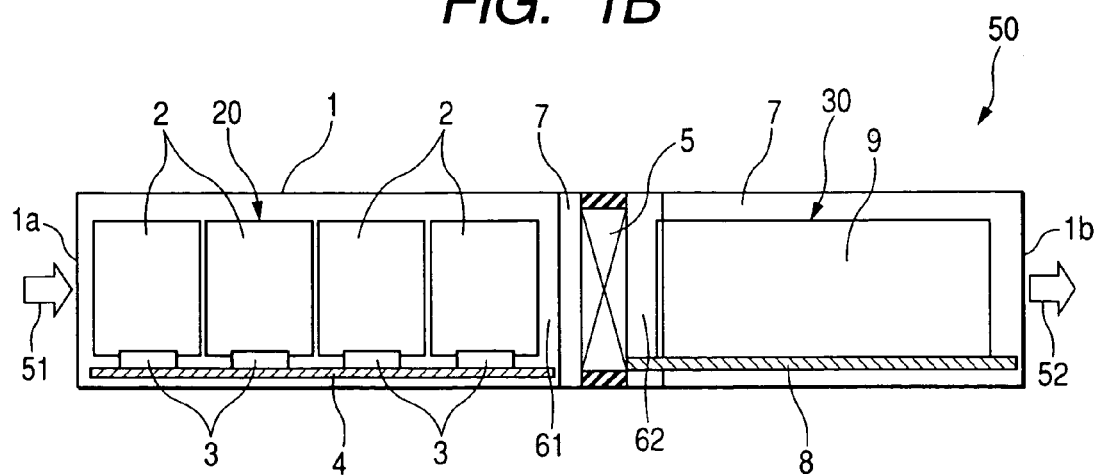
FIG. 1B is a side sectional view of the disk array apparatus of FIG. 1A.

A disk array apparatus according to a first embodiment of the present invention will be described with reference to FIGS. 1A and 1B. FIG. 1A is a plan sectional view of the disk array apparatus according to the first embodiment of the present invention, and FIG. 1B is a side sectional view of the disk array apparatus of FIG. 1A.

A disk array apparatus 50 is configured by a casing 1, a disk drive group 20, a controller unit 30, cooling fans 5, and backflow prevention members 7.

The casing 1 is formed in a rectangular shape, and has an inlet 1a on one side and an outlet 1b on the other side. Specifically, the casing 1 has the inlet 1a on the whole front face and the outlet 1b on the whole rear face.

The disk drive group 20 is composed of a plurality of magnetic or optical disk drives 2 which are arranged on one side in the casing 1. The disk drives 2 are laid out in a grid pattern or in-line arrangement, in which four lines are formed in the vertical direction and fourteen lines are formed in the horizontal direction, while clearance for ventilation is provided in FIG. 1A, and occupy approximately half of the casing 1 on the front side.

The disk drive 2 is formed in an oblong, rectangular shape, and has a disk body in which a disk, a driving motor, a head, an actuator, and the like are mounted. Main heating sources in the disk drive 2 are the driving motor, the actuator, and electronic components for control such as the LSI. The heat generated by these components is cooled by cooling air that is supplied by the cooling fans 5 provided within the casing 1. These disk drives 2 are connected with a first mother board 4 via connectors 3. The first mother board 4 is connected with a second mother board 8 via wiring that is not shown in the drawing.

The controller unit 30 is configured by a plurality of circuit substrates 9 which are arranged on the other side in the casing 1 and the second mother board 8 on which these circuit substrates 9 are mounted. Each of the circuit substrates 9 mounts thereon electronic components such as a power source and a controller, and is connected with the second mother board 8 via connectors that are not shown in the drawing. These circuit substrates 9 are vertically arranged on the second mother board 8 so as to extend in parallel with each other while securing the mounted electronic components and clearance for ventilation. The circuit substrates 9 occupy approximately half of the casing 1 on the rear side. Between the disk drive group 20 and the controller unit 30, there is provided a space for securing the cooling fans 5, and an inlet space 61 and an outlet space 62 that are located in front of and at the rear of the cooling fans 5, respectively.

The plurality of cooling fans 5 (six in the drawing) are provided so as to ventilate and cool the disk drive group 20 and the controller unit 30. These cooling fans 5 are arranged between the disk drive group 20 and the controller unit 30 in the casing 1. Thereby, noise generated by the cooling fans 5 is blocked by the disk drive group 20 and the controller unit 30 so that noise leaked outside can be dramatically reduced. Further, these cooling fans 5 are provided while being horizontally aligned so as to draw in cooling air from the side of the disk drive group 20 and make the same flow to the side of the controller unit 30.

Outside air is drawn in from the whole inlet 1a as shown by an arrow 51 by operation of the plurality of cooling fans 5 that are horizontally aligned in order to cool the disk drives 2 having heating elements. As the air flows downstream, the temperature of the air becomes higher. After passing through all the cooling fans 5, the temperature of the air becomes much higher by cooling the circuit substrates 9 and the air is discharged outside from the whole outlet 1b as shown by an arrow 52. Accordingly, it is possible to uniformly cool the disk drive group 20 and to prevent the variation in temperature between the plurality of disk drives. As a result, malfunction can be prevented and reliability can be secured in the long term.

Each of the backflow prevention members 7 protrudes on both sides of the disk drive group and the controller unit from between the cooling fans 5, and extends so as to define the inlet space 61 and the outlet space 62 of the cooling fans 5. In the case where the cooling fans 5 fail to operate properly and stop, the provision of the backflow prevention members 7 can prevent cooling air, which is made to flow from the adjacent cooling fans 5, from flowing back through the failed cooling fans 5. Accordingly, even if one of the cooling fans 5 fails to operate properly and stops, the cooling performance on the disk drive group 20 can be secured, and as a result, the cooling redundancy can be secured. Since the functions of the backflow prevention members 7 are not affected by the installing direction of the casing 1, it is possible to uniformly cool the disk drive group 20 by the plurality of cooling fans 5 without being affected by the installing direction of the casing 1. Further, since the backflow at the cooling fans 5 can be prevented without providing an operation unit, noise which is intermittently generated by the cooling fans 5 is not generated and reliability of the backflow prevention mechanism is essentially very high.

In a typical case, in the case where any one of the cooling fans 5 in the casing 1 fails to operate properly in a state where no backflow prevention members are provided, the flow velocity around the disk drives 2 in the vicinity of the failed cooling fan 5 is reduced and the cooling performance is deteriorated because large backflow occurs at the portion of the failed cooling fan 5. Here, in the case where the cooling fan 5 positioned around the middle portion of the casing 1 fails to operate properly, air around the disk drives 2 in the vicinity of the failed cooling fan 5 is drawn in by the other cooling fans 5 positioned on the both sides of the failed cooling fan 5. Therefore, it is conceivable that the amount of cooling air flow is prevented from reducing by measures such as increasing the driving voltage for the other cooling fans 5 more than usual so as not to greatly decrease the cooling performance. However, in the case where the cooling fans 5, which are positioned at both ends and are adjacent to both wall faces 1c of the casing 1, fail to operate properly, air around the disk drives 2 in the vicinities of the failed cooling fans 5 is drawn in from one side, so that the disk drives 2 in the vicinities of the failed cooling fans 5 are remarkably affected by the backflow. Specifically, the flow of air around the disk drives 2 in the vicinities of the failed cooling fans 5, especially the flow of air on the sides of the wall faces of the casing 1 stagnates and hardly contributes to the cooling. In addition, since warm air stays therein, the temperature of the disk drives 2 in the vicinities of the failed cooling fans 5 rises. This state is not sufficiently improved because the increasing of the driving voltage for the other cooling fans 5 merely increases the flow velocity in the middle portion of the casing 1.

In the first embodiment, each of the backflow prevention members 7 is provided so as to protrude from between each of the cooling fans 5, which are positioned at both ends and are adjacent to the both wall faces 1c of the casing 1, and each of the cooling fans 5, which are positioned on the middle side and are adjacent to the cooling fans 5 that are positioned at both ends. Further, each of the backflow prevention members 7 is provided so as to extend towards the outlet 1b of the casing 1 while providing a space between each of the backflow prevention members 7 and each of the both wall faces 1c of the casing 1. With this configuration, in the case where the cooling fans 5 positioned at both ends fail to operate properly, it is possible to reliably prevent the backflow within the casing 1 from occurring.

Further, in the first embodiment, the farther apart each of the back flow prevention members 7 is from the cooling fans 5, the closer each of them extends to each of the wall faces 1c of the casing 1. Since there is provided a space for ventilation between each of the tip ends of the backflow prevention members 7 and each of the wall faces 1c of the casing 1, a flow path formed on each side of the side walls of the casing 1 is narrowed down on the upstream side of the cooling fans 5 while a distance of the flow path to the adjacent cooling fan 5 becomes longer. Further, in the case where the cooling fans 5 positioned at both ends fail to operate properly, air around the failed cooling fans 5 is unlikely to be drawn in by the adjacent cooling fans 5. Therefore, the backflow from the outside of the casing 1 can be effectively prevented.

The decrease in the amount of cooling air flow due to a failure of the cooling fans 5 can be compensated by increasing the driving voltage for the other cooling fans 5 more than usual. Accordingly, according to the first embodiment, in the case where any one of the cooling fans 5 in the casing 1 fails to operate properly, it is possible to maintain a good cooling condition for all the disk drives 2 including those in the vicinity of the failed cooling fan 5.

According to the disk array apparatus 50 of the above-described first embodiment, it is possible to uniformly cool the disk drive group, to secure the cooling redundancy for the disk drives, and to reduce noise generated by the cooling fans without being affected by the installing direction of the casing. As a result, it is possible to improve reliability of the disk array apparatus, to prolong the service life of the disk array apparatus, and to make the disk array apparatus high density, realizing the disk array apparatus with low-noise, high-capacity, and high-speed.

Second Embodiment

Figure 3:
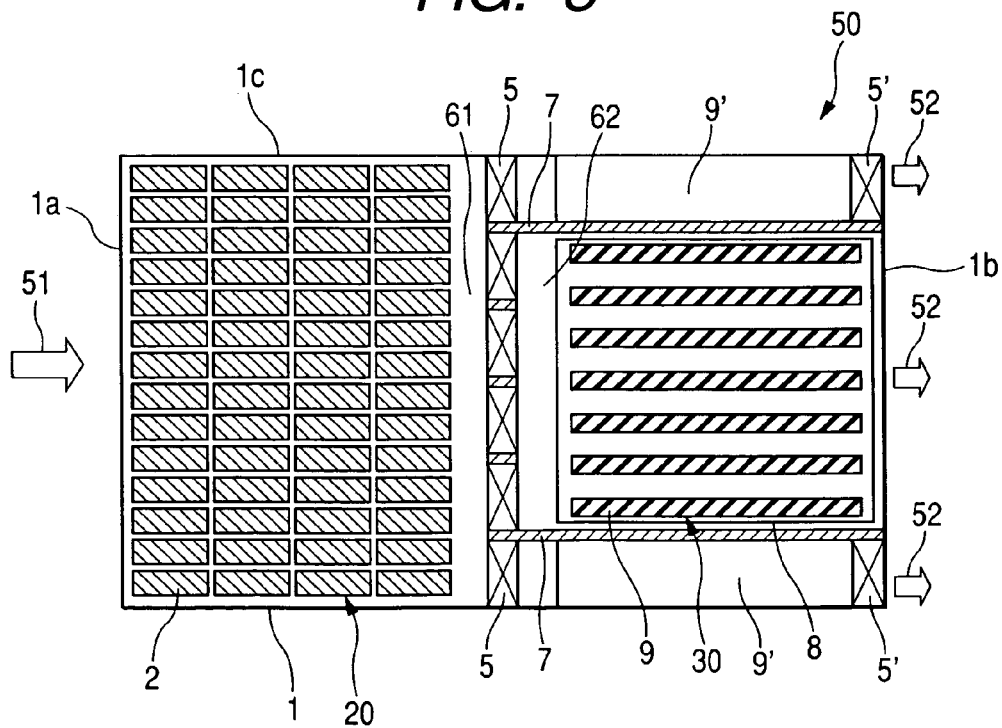
FIG. 3 is a plan sectional view of a disk array apparatus according to a second embodiment of the present invention.

FIG. 3 shows a plan sectional view of a disk array apparatus according to a second embodiment of the present invention. The followings are the points where the second embodiment differs from the above-described first embodiment.

In the second embodiment, each of the backflow prevention members 7 protrudes only on the side of the controller unit from between each of the cooling fans 5, which are positioned at both ends and are adjacent to the both wall faces 1c of the casing 1, and each of the cooling fans 5, which are positioned on the middle side and are adjacent to the cooling fans 5 that are positioned at both ends. Further, each of the backflow prevention members 7 linearly extends towards the outlet 1b of the casing 1 while providing a space between each of the backflow prevention members 7 and each of the both wall faces 1c of the casing 1. Furthermore, each of power sources 9' is provided in each of spaces defined by each of the backflow prevention members 7 and each of the both wall faces 1c of the casing 1, while each of cooling fans 5' is provided at each of the rearmost portions of the power sources 9'.

According to the second embodiment, the disk array apparatus can be downsized because each of the power sources 9' is arranged in each of the spaces that become dead spaces. Further, the cooling fan 5 and the cooling fan 5' form a push-pull configuration, and accordingly, in the case where one of either of the cooling fan 5 or the cooling fan 5' fails to operate properly, the other one of either of the cooling fan 5 or the cooling fan 5' ventilates and thus, no backflow occurs. The decrease in the amount of cooling air flow due to a failure of one of the cooling fan 5 and the cooling fan 5' can be compensated by increasing the driving voltage for the other one of the cooling fan 5 and the cooling fan 5' more than usual.

In the case where the cooling fan 5 and the cooling fan 5' fail to operate properly at the same time, the backflow prevention function can be exercised by the backflow prevention members 7. In this case, the power sources 9' and the cooling fans 5' serve as flow resistance, which leads to a little backflow from the outside of the casing 1.

Third Embodiment

Figure 4:
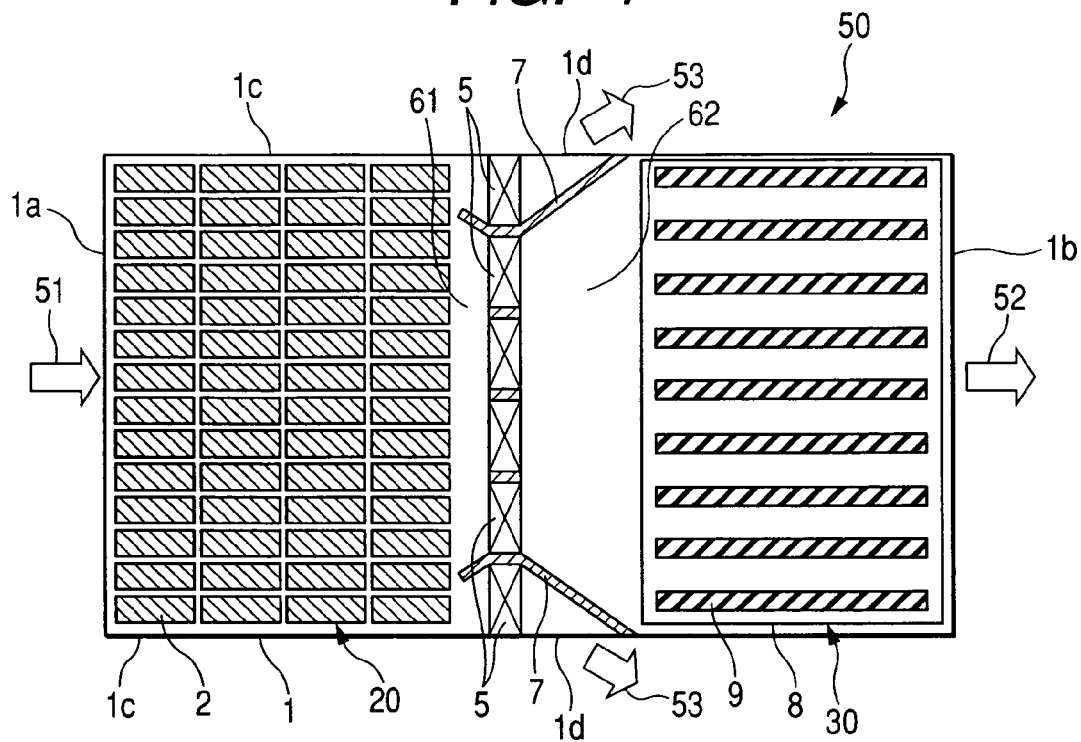
FIG. 4 is a plan sectional view of a disk array apparatus according to a third embodiment of the present invention.

FIG. 4 shows a plan sectional view of a disk array apparatus according to a third embodiment of the present invention. The followings are the points where the third embodiment differs from the above-described first embodiment.

In the third embodiment, each of the portions of the backflow prevention members 7 that protrudes on the side of the controller unit extends up to each of the both wall faces 1c of the casing 1 from between the cooling fans 5. Further, on each of the both wall faces 1c, there is provided each of auxiliary outlets 1d in communication with spaces formed between each of the both wall faces 1c of the casing 1 and each of the backflow prevention members 7. Thereby, discharge air from the cooling fans 5 positioned at both ends of the casing 1 is discharged from the auxiliary outlets 1d on the both wall faces 1c. In the meantime, discharge air from the cooling fans 5 positioned in the middle side of the casing 1 is discharged from the outlet 1b on the rear face of the casing 1.

According to the third embodiment, each of the cooling fans 5 positioned at both ends is separated from the other cooling fans 5 positioned in the middle side on the flowing side by each of the backflow prevention members 7. Accordingly, in the case where the cooling fans 5 positioned at both ends fail to operate properly, it is possible to completely prevent the backflow within the casing 1 from occurring. Further, since the side faces of the casing 1 are used as discharge areas, it is possible to reduce air-flow resistance within the casing. Accordingly, the load imposed on the cooling fans 5 can be lightened, which is advantageous in making the apparatus low-noise.

In the meantime, there is a case that the discharge area is not sufficiently secured because a plurality of cables or connectors for communicating to the outside of the casing 1 is provided on the rear face of the casing 1. In such a case, the third embodiment is especially effective.

Fourth Embodiment

Figure 5:
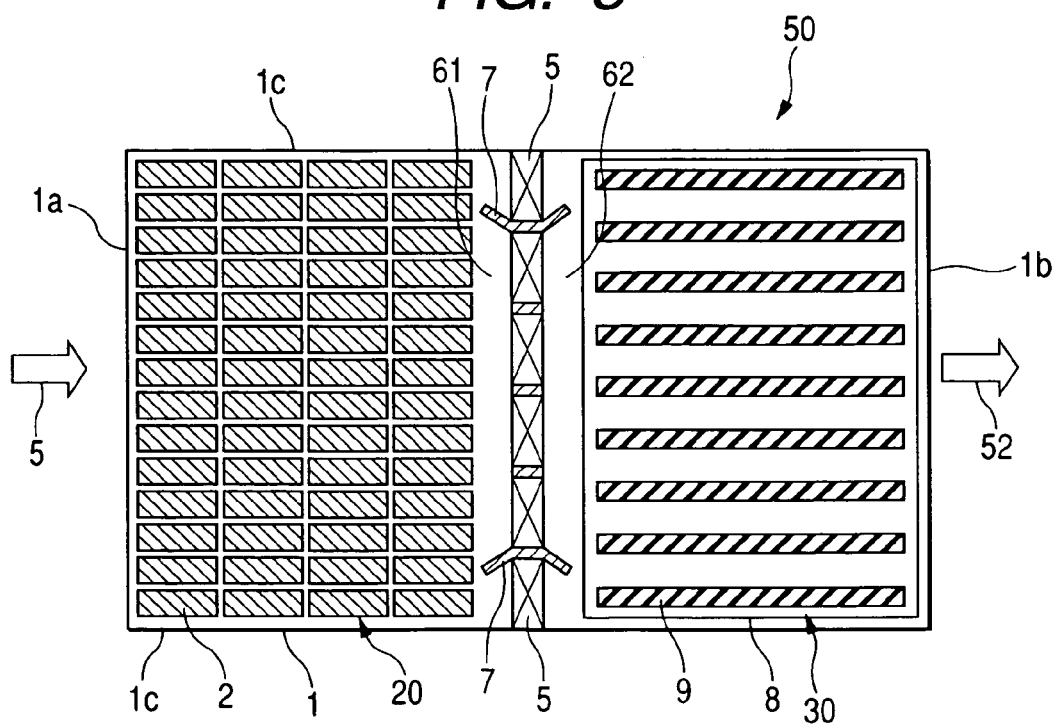
FIG. 5 is a plan sectional view of a disk array apparatus according to a fourth embodiment of the present invention.
Figure 6:
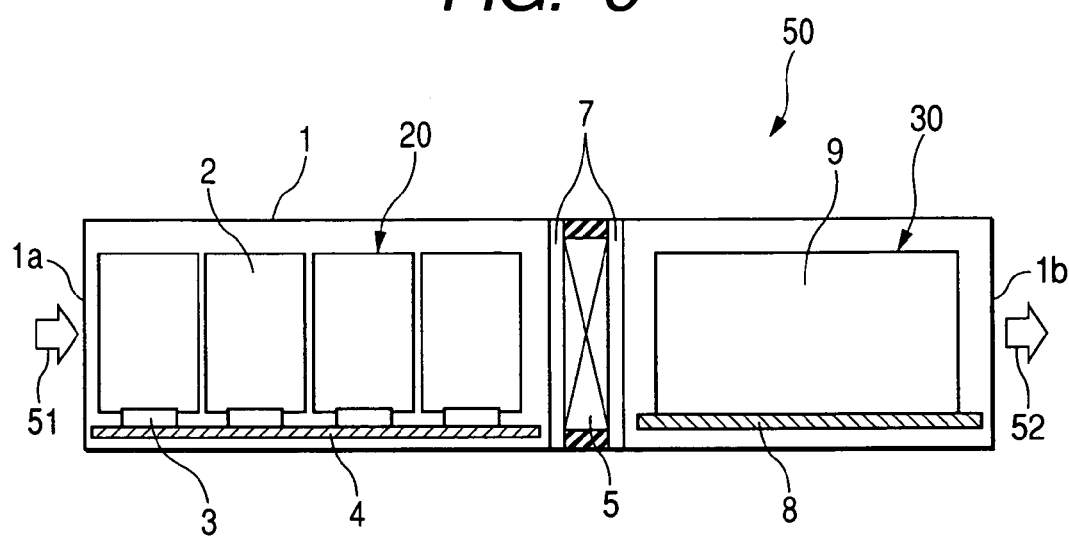
FIG. 6 is a side sectional view of the disk array apparatus of FIG. 5.

FIGS. 5 and 6 respectively show a plan sectional view and a side sectional view of a disk array apparatus according to a fourth embodiment of the present invention. The followings are the points where the fourth embodiment differs from the above-described first embodiment.

In the fourth embodiment, each of the backflow prevention members 7 is provided only between the disk drive group 20 and the controller unit 30, and each of the backflow prevention members 7 extends closer to each of the wall faces 1c of the casing 1 as it gets farther apart from the cooling fans 5, while providing a space for ventilation between each of the tip ends of the backflow prevention members 7 and each of the wall faces 1c of the casing 1.

According to the fourth embodiment, the controller unit 30 can be provided throughout the distance between the both wall faces 1c of the casing 1. Further, a flow path formed on each side of the wall faces 1c is narrowed down in front of and at the rear of the cooling fans 5, and a distance of the flow path to the adjacent cooling fan 5 becomes longer, which minimizes the occurrence of the backflow in the case where the cooling fans 5 positioned at both ends fail to operate properly.

Fifth Embodiment

Figure 7:
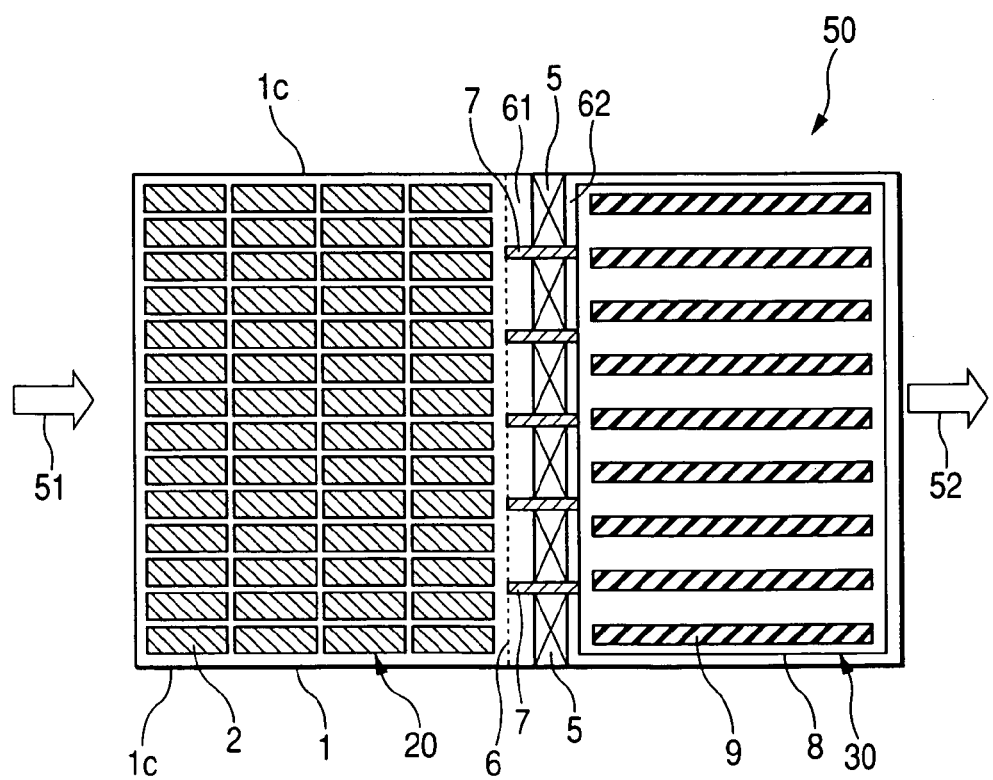
FIG. 7 is a plan sectional view of a disk array apparatus according to a fifth embodiment of the present invention.
Figure 8:
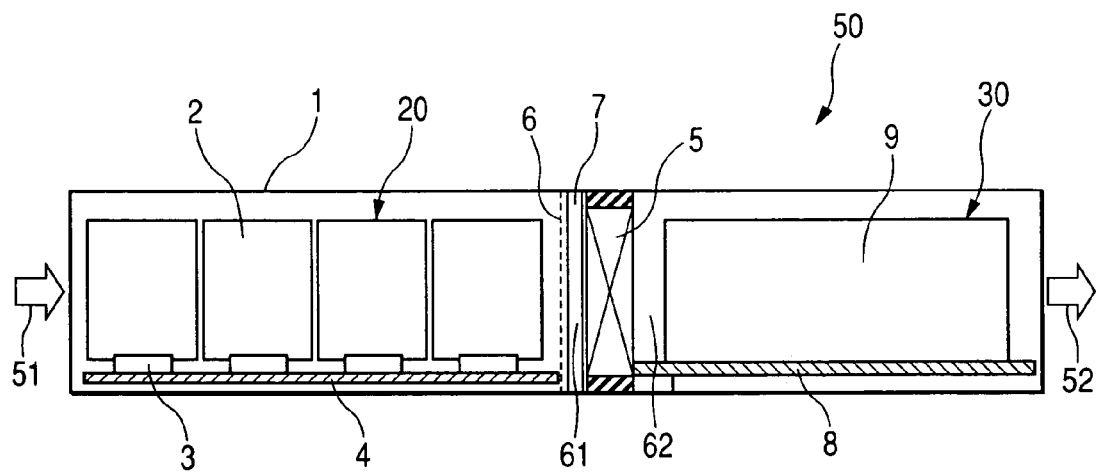
FIG. 8 is a side sectional view of the disk array apparatus of FIG. 7.

FIGS. 7 and 8 respectively show a plan sectional view and a side sectional view of a disk array apparatus according to a fifth embodiment of the present invention. The followings are the points where the fifth embodiment differs from the above-described fourth embodiment.

In the fifth embodiment, there is provided a resistive element 6 serving as ventilation resistance between the cooling fans 5 that are horizontally aligned and the disk drive group 20, and each of the backflow prevention members 7 is provided between the resistive element 6 and the respective cooling fans 5. There are uniformly formed a plurality of ventilating holes on the resistive element 6.

In the case where no resistive element 6 is provided, the flow velocity distribution largely differs between the vicinities of the cooling fans 5 and areas a little distance away therefrom. Accordingly, the heating elements of the respective disk drives 2 of the disk drive group 20 are likely to differ from each other in temperature depending on the positions thereof. On the contrary, in the configuration as the fifth embodiment, since the aperture ratio of the ventilating holes formed on the resistive element 6 is uniform, the flow velocity at the respective disk drives 2 becomes even in the cross section of the flow path. As described above, since the air flow becomes uniform by providing the resistive element 6, the flow velocity around the respective disk drives 2 on the side of the lowermost stream becomes even irrespective of the positions thereof. As a result, the disk drive group 20 can be uniformly cooled.

Further, the resistive element 6 functions to reduce the amount of backflow with its flow resistance. Since the backflow prevention members 7 and the resistive element 6 become large flow resistance with respect to the backflow from the failed cooling fans 5, the backflow prevention members 7 and the resistive element 6 synergistically function so as to minimize the occurrence of the backflow. Accordingly, even if the amount of the protrusion of the backflow prevention members 7 is suppressed on the controller unit side, it is possible to obtain the effect of the backflow prevention and to enlarge a space in which the controller unit 30 can be provided by the difference of the suppression.

Further, even if operation conditions of the cooling fans 5 in the casing 1 differ, the provision of the resistive element 6 automatically adjusts the air flow between the disk drives 2 and the resistive element 6, so that the flow velocity around the respective disk drives 2 becomes uniform. If the cooling fans 5 fail to operate properly, air around the disk drives 2 in the vicinities of the failed cooling fans 5 is drawn in by the cooling fans 5 positioned apart from the failed cooling fans 5. As described above, in the case where any one of the cooling fans 5 in the casing 1 fails to operate properly, it is possible to maintain a good cooling condition for the respective disk drives 2.

Sixth Embodiment

Figure 9:
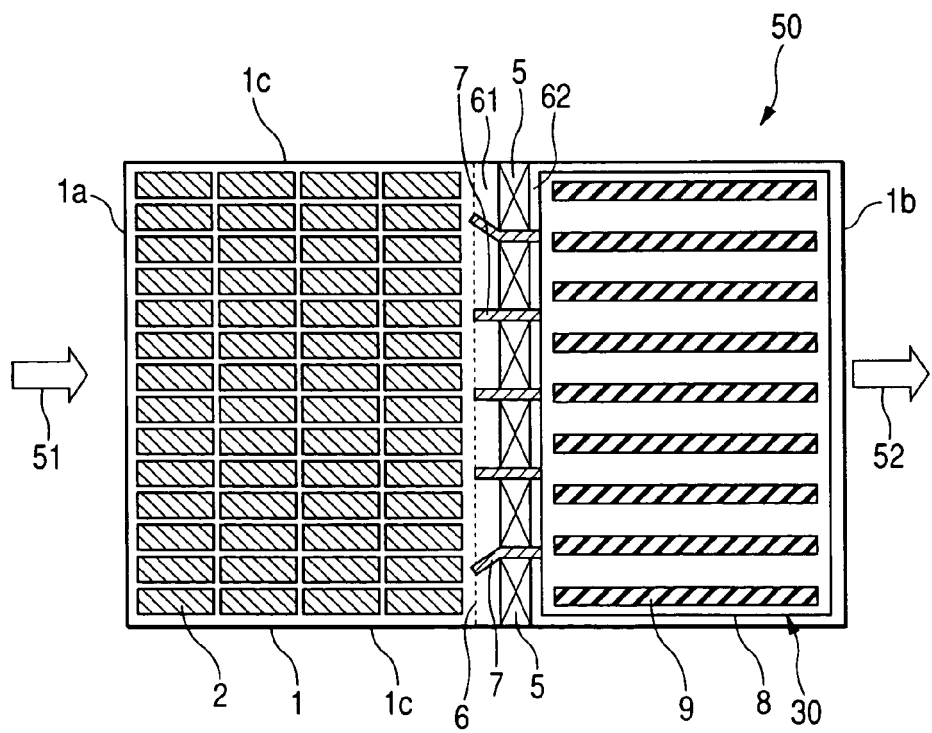
FIG. 9 is a plan sectional view of a disk array apparatus according to a sixth embodiment of the present invention.

FIG. 9 shows a plan sectional view of a disk array apparatus according to a sixth embodiment of the present invention. The followings are the points where the sixth embodiment differs from the above-described fifth embodiment.

The sixth embodiment is the embodiment obtained by combining the fourth embodiment with the fifth embodiment. That is, only each of the backflow prevention members 7 protruding on the side of the disk drive from between each of the cooling fans 5, which are positioned at both ends and are adjacent to the both wall faces 1c of the casing 1, and each of the cooling fans 5, which are positioned on the middle side and are adjacent to the cooling fans 5 that are positioned at both ends, extends so as to become closer to each of the wall faces 1c as it becomes farther apart from the cooling fans 5 while providing a space for ventilation between each of the tip ends of the backflow prevention members 7 and each of the wall faces 1c of the casing 1.

According to the sixth embodiment, the effects of the fourth embodiment and the fifth embodiment are combined to be exercised.

Seventh Embodiment

Figure 2:
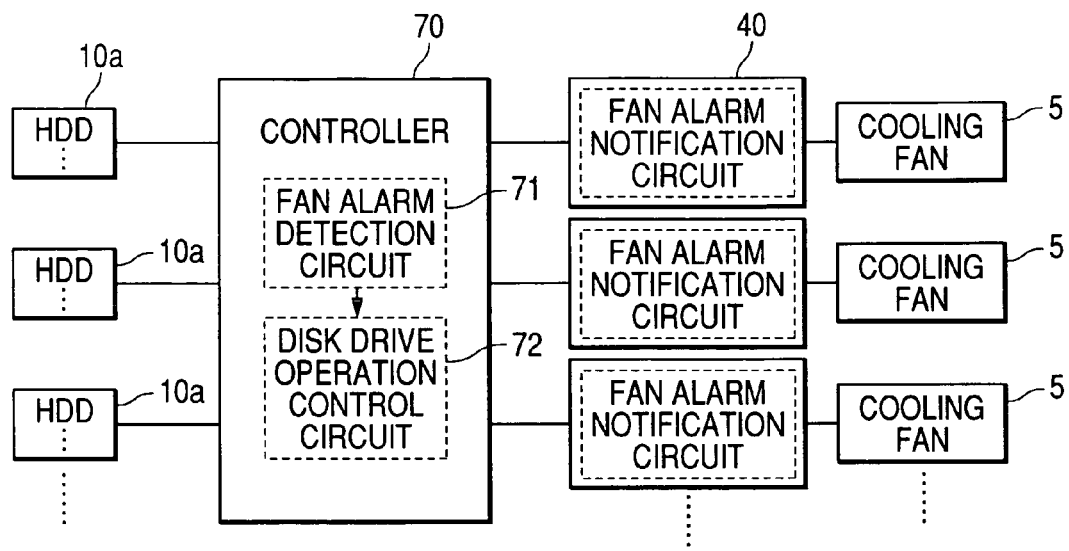
FIG. 2 is a control configuration view of a disk array apparatus of FIGS. 10 and 11.
Figure 10:
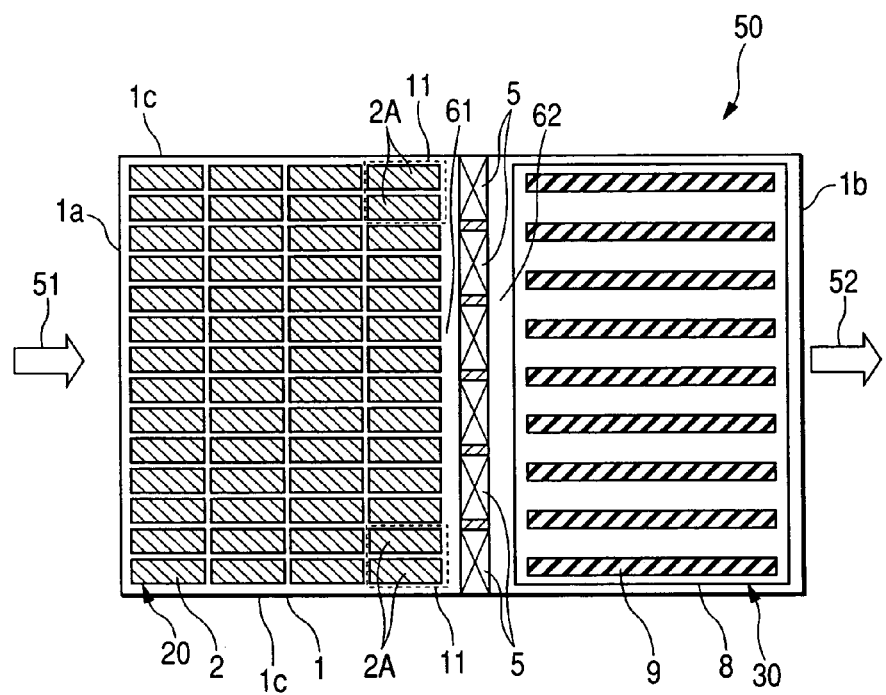
FIG. 10 is a plan sectional view of a disk array apparatus according to a seventh embodiment of the present invention.
Figure 11:
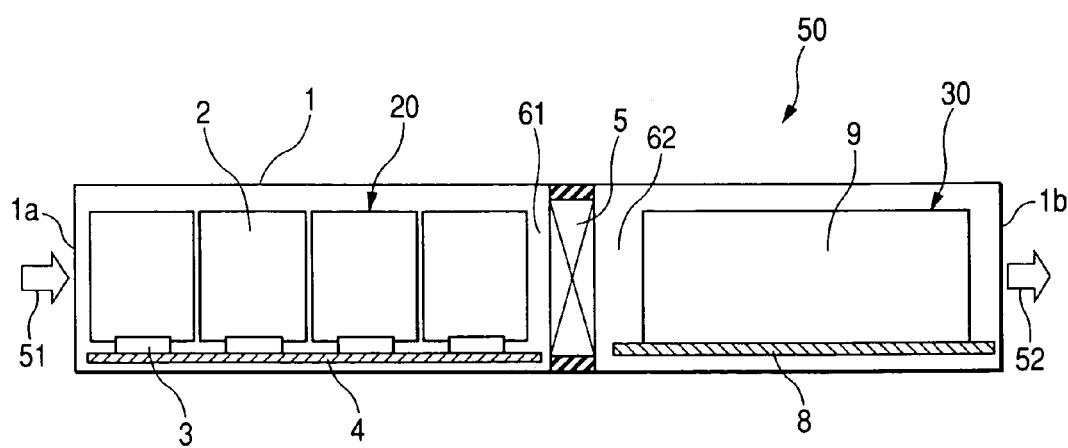
FIG. 11 is aside sectional view of the disk array apparatus of FIG. 10.

FIGS. 10 and 11 respectively show a plan sectional view and a side sectional view of a disk array apparatus according to a seventh embodiment of the present invention. FIG. 2 shows a control configuration view of the disk array apparatus of FIGS. 10 and 11 according to a seventh embodiment of the present invention. The followings are the points where the seventh embodiment differs from the above-described first embodiment.

In the seventh embodiment, the backflow prevention members 7 are not provided, disk drives 2A within each of specified areas 11 in the vicinities of the cooling fans 5 positioned at both ends in the casing 1 are electrically connected with the circuit substrates 9 having controller functions, and the cooling fans 5 positioned at both ends are electrically connected with the circuit substrates 9. When the cooling fans 5 positioned at both ends among the cooling fans 5 in the casing 1 abnormally stop, information stored on the disk drives 2A within each of the specified areas 11 is transferred to the other disk drives 2 located outside the specified areas 11 on the basis of a command issued from the circuit substrates 9 having controller functions, and then the disk drives 2A within each of the specified areas 11 are stopped.

The controller unit 30 comprises a controller 70 having a fan alarm detection circuit 71 and a disk drive operation control circuit 72 as shown in FIG. 2. The controller 70 is connected with both fan alarm notification circuits 40 and divided disk drive groups 10a obtained by dividing the disk drive group 20. The fan alarm notification circuit 40 detects a fact that the cooling fan 5 stops due to a failure thereof and the like. When the fan alarm notification circuit 40 detects a fact that the cooling fan 5 stops, the fan alarm notification circuit 40 sends an alarm to the controller 70. When the controller 70 detects the alarm signal from the fan alarm notification circuit 40 in the fan alarm detection circuit 71, the controller 70 transmits a control signal to the disk drive operation control circuit 72 and controls so as to stop the divided disk drive group 10a in the vicinity of the cooling fan 5 that has stopped.

According to the disk array apparatus of the seventh embodiment, even if the cooling fans 5 positioned at both ends in the casing 1 fail to operate properly and stop, it is possible to secure the cooling redundancy for the disk drive group 20. Consequently, like the first embodiment, it is possible to uniformly cool the disk drive group and to reduce noise generated by the cooling fans without being affected by the installing direction of the casing. As a result, it is possible to improve reliability of the disk array apparatus, to prolong the service life of the disk array apparatus, and to make the disk array apparatus high density, realizing the disk array apparatus with low-noise, high-capacity, and high-speed.

Eighth Embodiment

Figure 12:
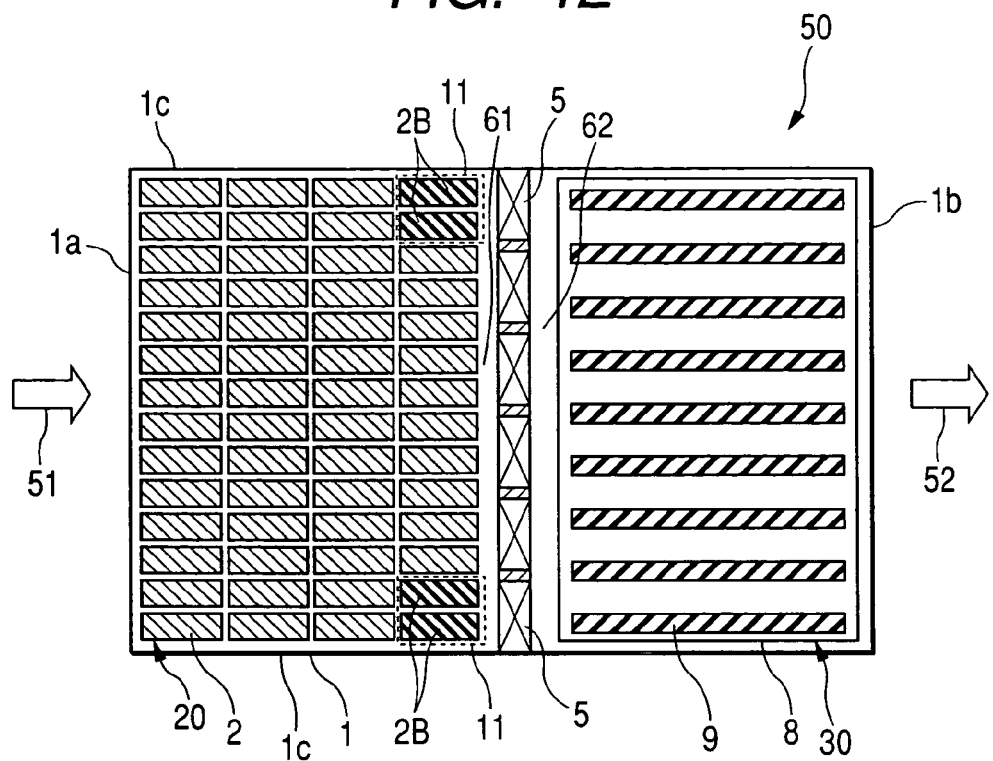
FIG. 12 is a plan sectional view of a disk array apparatus according to an eighth embodiment of the present invention.

FIG. 12 shows a plan sectional view of a disk array apparatus according to an eighth embodiment of the present invention. The followings are the points where the eighth embodiment differs from the above-described seventh embodiment.

In the eighth embodiment, disk drives 2B within each of the specified areas 11 in the vicinities of the cooling fans 5 positioned at both ends in the casing 1 are dummies. According to the eighth embodiment, even if the cooling fans 5 positioned at both ends among the cooling fans 5 in the casing 1 abnormally stop, it is possible to maintain the respective disk drives 2 at an appropriate temperature or less without any problems in terms of cooling because the disk drives 2B, which are to be affected by the failure of the cooling fans 5, within each of the specified areas 11 are dummies.

Ninth Embodiment

Figure 13:
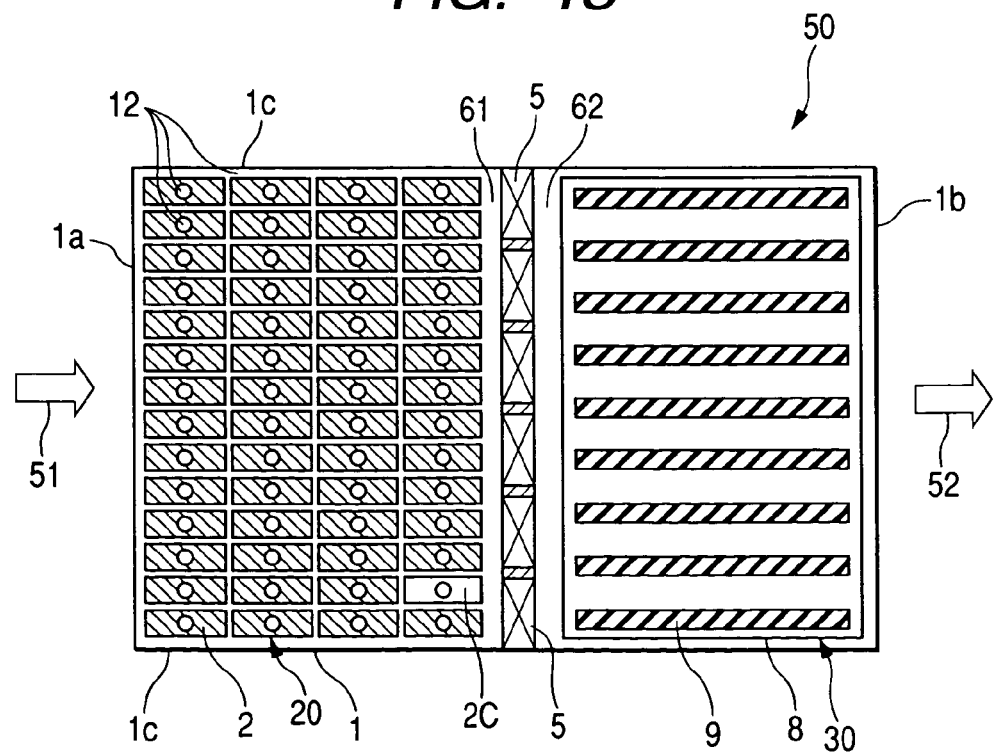
FIG. 13 is a plan sectional view of a disk array apparatus according to a ninth embodiment of the present invention.

FIG. 13 shows a plan sectional view of a disk array apparatus according to a ninth embodiment of the present invention. The followings are the points where the ninth embodiment differs from the above-described seventh embodiment.

In the ninth embodiment, each of sensors 12 for monitoring the temperature of the respective disk drives 2 is attached, and the sensors 12 are electrically connected with the circuit substrates 9 having controller functions.

Hereinafter, the operation of the respective disk drives 2 will be described. Upon receiving a command transmitted from the controller on the circuit substrate 9, the disk drive 2 is switched to any one of operation statuses of "ready", "not ready", and "poweroff". The disk drive 2 operated in the "ready" status among these statuses can receive a read/write command for data that is sent from the controller. The disk drive 2 operated in the "ready" status is rotated at a rotation speed required for reading/writing data. When the disk drive 2 is operated in the "not ready" status, the disk drive 2 is not rotated at a rotation speed required for reading/writing data. Note that the disk drive 2 operated in the "not ready" status does not receive a command relating to the read/write for data, but can receive a specific kind of command such as a command for making the transition to the "ready" status. When the disk drive 2 is in the "power off" status, the disk drive 2 can not receive a command that is transmitted from the controller. Further, the disk drive 2 completely stops its rotation. The average power consumption of the disk drive 2 is at the maximum when being operated in the "ready" status. The average power consumption of the disk drive 2 operated in the "not ready" status is much lower than that of the disk drive 2 operated in the "ready" status. The average power consumption of the disk drive 2 is 0 when being in the "power off" status.

In this configuration, if any one of the temperature sensors 12, each of which is attached to the respective disk drives 2, exceeds a first preset temperature due to a failure of the cooling fan 5 and the like, the circuit substrates 9 having controller functions operate to backup data stored on the disk drive 2C exceeding the first preset temperature to the other disk drive 2 and to switch the disk drive 2C from the "ready" status to the "not ready" status after the backup of the data is completed.

As described above, the power consumption of the disk drive 2 operated in the "not ready" status is much lower than that of the disk drive 2 operated in the "ready" status, so that the temperature of the disk drive 2C begins to lower.

Further, in the ninth embodiment, in the case where the temperature of the disk drive 2C lowers below a second preset temperature which is lower than the first preset temperature, the circuit substrates 9 having controller functions switch the disk drive 2C from the "not ready" status to the "ready" status.

With this configuration, the temperature of the respective disk drives 2 is controlled in an independent and dispersed manner, and accordingly, always maintained at an appropriate temperature.

Tenth Embodiment

Figure 14:
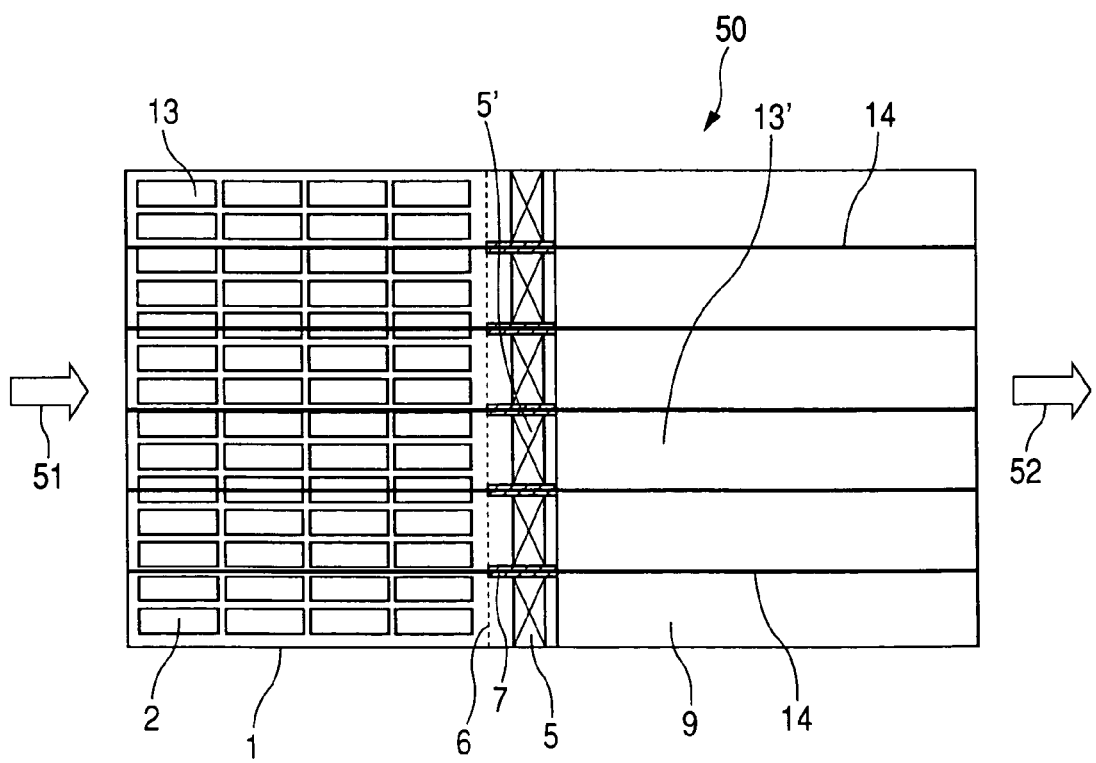
FIG. 14 is a plan sectional view of a disk array apparatus according to a tenth embodiment of the present invention.

FIG. 14 shows a plan view of a disk array apparatus according to a tenth embodiment of the present invention. The disk drive group 20 and the cooling fans 5 are shown in a perspective manner in FIG. 14. The followings are the points where the tenth embodiment differs from the above-described fifth embodiment.

In the tenth embodiment, covers 13 configuring an upper face of the casing 1 are divided on a predetermined unit of an area including the disk drive group 20 and even the cooling fan 5. The divided covers 13 are provided so as to be slidable in the vertical direction through slide rails 14 arranged on the upper face of the casing 1. The slide rails 14 are provided so as to extend from the front end to the rear end of the casing 1.

This configuration allows the range of the disk drive group 20 affected in terms of cooling to be minimized when performing maintenance on the disk array apparatus 50 while being operated.

According to the tenth embodiment, in the case where any one of the disk drives 2 or any one of the cooling fans 5 fails to operate properly, maintenance for the disk array apparatus 50 can be performed by opening the cover 13 corresponding to the failed portion without stopping the disk drives 2 and the cooling fans 5 positioned in the other areas.

The above-described configuration of the disk array apparatus 50 according to the tenth embodiment can be applicable to any of the above-described embodiments other than the fifth embodiment.

What is claimed is:

1. A disk array apparatus comprising:
   a casing having an inlet on one side and an outlet on the other side;
   a disk drive group configured by a plurality of disk drives that are arranged on one side in said casing;
   a controller unit configured by a plurality of circuit substrates that are arranged on the other side in said casing; and
   a plurality of cooling fans for ventilating said disk drive group and said controller unit, wherein:
   said plurality of cooling fans are arranged between said disk drive group and said controller unit in said casing and are provided while being aligned so as to draw in cooling air from the side of said disk drive group and makes the cooling air flow to the side of said controller unit; and
   backflow prevention members are provided so as to protrude on the side of said disk drive group or on the side of said controller unit from between said cooling fans while extending so as to define a space on the inlet side or on the outlet side of the cooling fans.

2. The disk array apparatus according to claim 1, wherein each of said backflow prevention members extends so as to protrude on the side of said disk drive group or on the side of said controller unit from between each of the cooling fans, which are positioned at both ends and are adjacent to both wall faces of said casing, and each of the cooling fans, which are positioned on the middle side and are adjacent to the cooling fans that are positioned at both ends.

3. The disk array apparatus according to claim 2, wherein each of said backflow prevention members extends so as to protrude on the side of said controller unit towards the outlet of said casing from between each of cooling fans, which are positioned at both ends and are adjacent to the wall faces of said casing, and each of the cooling fans, which are positioned on the middle side and are adjacent to the cooling fans that are positioned at both ends, while providing a space between each of said backflow prevention members and each of the wall faces of said casing.

4. The disk array apparatus according to claim 3, wherein a power source is arranged in space formed between said backflow prevention member and the wall face of said casing and a cooling fan is provided on the outlet side of the space.

5. The disk array apparatus according to claim 2, wherein each of said backflow prevention members extends so as to become closer to each of the wall faces of said casing as it gets farther apart from said cooling fans while providing a space for ventilation between each of the tip ends of the backflow prevention members and each of the wall faces of said casing.

6. The disk array apparatus according to claim 2, wherein each of said backflow prevention members extends up to each of the wall faces of said casing from between said cooling fans while protruding on the side of said controller unit and there is formed each of auxiliary outlets in communication with each of spaces formed by each of the both wall faces of said casing and each of said backflow prevention members.

7. The disk array apparatus according to claim 1, wherein a resistive element, on which a plurality of ventilating holes are uniformly formed, is provided between said aligned cooling fans and the disk drive group and said backflow prevention members are provided between said resistive element and the cooling fans.

8. The disk array apparatus according to claim 7, wherein said backflow prevention members are provided so as to define all boundaries between said cooling fans that are aligned.

9. A disk array apparatus comprising:

a casing having an inlet on one side and an outlet on the other side;

a disk drive group configured by a plurality of disk drives that are arranged on one side in said casing;

a controller unit configured by a plurality of circuit substrates that are arranged on the other side in said casing; and a plurality of cooling fans for ventilating said disk drive group and said controller unit, wherein:

said plurality of cooling fans are arranged between said disk drive group and said controller unit in said casing and are provided while being aligned so as to draw in cooling air from the side of said disk drive group and makes the cooling air flow to the side of said controller unit; and the disk drives within each of the specified areas in the vicinities of the cooling fans positioned at both ends in said casing are dummies.

* * * * *